(12) United States Patent
Lesso et al.

(10) Patent No.: US 11,646,708 B2
(45) Date of Patent: May 9, 2023

(54) DRIVER CIRCUITRY

(71) Applicant: Cirrus Logic International Semiconductor Ltd., Edinburgh (GB)

(72) Inventors: John P. Lesso, Edinburgh (GB); Toru Ido, Kanagawa (JP)

(73) Assignee: Cirrus Logic, Inc., Austin, TX (US)

( * ) Notice: Subject to any disclaimer, the term of this patent is extended or adjusted under 35 U.S.C. 154(b) by 352 days.

(21) Appl. No.: 17/113,561

(22) Filed: Dec. 7, 2020

(65) Prior Publication Data

US 2022/0182028 A1   Jun. 9, 2022

(51) Int. Cl.
*H03G 3/30* (2006.01)
*H03F 3/183* (2006.01)
*H04R 17/00* (2006.01)

(52) U.S. Cl.
CPC .......... *H03G 3/3005* (2013.01); *H03F 3/183* (2013.01); *H04R 17/00* (2013.01); *H03F 2200/03* (2013.01); *H03G 2201/103* (2013.01)

(58) Field of Classification Search
CPC ....................................................... H03G 3/30
See application file for complete search history.

(56) References Cited

U.S. PATENT DOCUMENTS

| 4,263,527 | A |   | 4/1981 | Comstock |                |
|-----------|---|---|--------|----------|----------------|
| 4,445,063 | A | * | 4/1984 | Smith    | B06B 1/0253    |
|           |   |   |        |          | 331/154        |
| 6,246,152 | B1| * | 6/2001 | Fontanella | H03F 3/3028  |
|           |   |   |        |          | 310/317        |
| 6,504,669 | B1| * | 1/2003 | Janz     | G11B 5/483     |
| 8,884,492 | B2| * | 11/2014| Schroeder | H02N 2/062    |
|           |   |   |        |          | 310/316.01     |
| 9,103,670 | B1| * | 8/2015 | Ekchian  | G01C 9/20      |
| 9,627,602 | B1| * | 4/2017 | Guzik    | G11B 5/483     |
| 2002/0025595 | A1 | * | 2/2002 | Xu | H01H 59/0009 |
|           |   |   |        |          | 257/415        |
| 2018/0183357 | A1 | * | 6/2018 | Ouattara | G01J 3/26   |
| 2019/0028072 | A1 | * | 1/2019 | Lesso | H03F 1/34      |
| 2019/0306641 | A1 |   | 10/2019 | Wilson |                |
| 2019/0337014 | A1 |   | 11/2019 | Chatain et al. |          |

FOREIGN PATENT DOCUMENTS

CN   112821804 A  *  5/2021  ............. G05B 19/19

OTHER PUBLICATIONS

International Search Report and Written Opinion of the International Searching Authority, International Application No. PCT/GB2021/052399, dated Dec. 23, 2021.
Kaizuka, Hiroshi, and Siu, Byron: "A Simple Way to Reduce Hysteresis and Creep When Using Piezoelectric Actuators", Japanese Journal of Applied Physics, Japan Society of Applied Physics, JP, vol. 27, No. 5, May 1, 1988.

* cited by examiner

*Primary Examiner* — Olisa Anwah
(74) *Attorney, Agent, or Firm* — Jackson Walker L.L.P.

(57) ABSTRACT

The present disclosure relates to circuitry for driving a piezoelectric transducer. The circuitry comprises amplifier circuitry configured to receive a drive signal and to output an output signal, based on the drive signal, to the piezoelectric transducer, a variable capacitor configured to be coupled in series with the piezoelectric transducer, and control circuitry. The control circuitry is configured to control a capacitance of the variable capacitor to compensate for hysteresis in the piezoelectric transducer and to control a gain of the amplifier circuitry to compensate for signal attenuation caused by the variable capacitor.

24 Claims, 7 Drawing Sheets

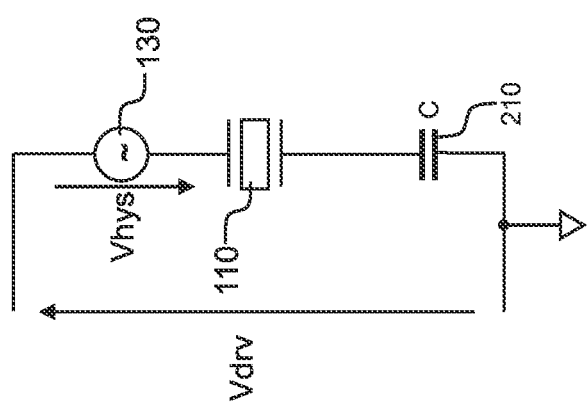

DRIVER CIRCUITRY

FIELD OF THE INVENTION

The present disclosure relates to driver circuitry, and in particular to driver circuitry for piezoelectric transducers.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

Piezoelectric transducers can be voltage-driven. However, when driven by voltage piezoelectric transducers exhibit both hysteresis and creep, which means that when the displacement of a piezoelectric transducer depends on both the currently-applied voltage and on a previously-applied voltage. Thus, for any given driving voltage there are multiple possible displacements of the piezoelectric transducer. For audio applications this manifests as distortion.

SUMMARY

According to a first aspect, the invention provides circuitry for driving a piezoelectric transducer, the circuitry comprising:
  amplifier circuitry configured to receive a drive signal and to output an output signal, based on the drive signal, to the piezoelectric transducer;
  a variable capacitor configured to be coupled in series with the piezoelectric transducer; and
  control circuitry, wherein the control circuitry is configured to control a capacitance of the variable capacitor to compensate for hysteresis in the piezoelectric transducer and to control a gain of the amplifier circuitry to compensate for signal attenuation caused by the variable capacitor.

The control circuitry may be configured to control the gain of the amplifier circuitry and the capacitance of the variable capacitor based at least in part on a parameter of the drive signal received by the amplifier circuitry.

The parameter may comprise one or more of:
  a volume of an audio signal represented by the drive signal;
  an envelope of the drive signal; and
  an instantaneous value of the drive signal.

The control circuitry may be configured to monitor a signal at a node coupled to the piezoelectric transducer and to control the gain of the amplifier circuitry and the capacitance of the variable capacitor based at least in part on the monitored signal.

The monitored signal may comprise a voltage across the piezoelectric transducer or a current through the piezoelectric transducer, for example.

The control circuitry may be configured to control the gain of the amplifier circuitry such that the output signal is at a predefined level.

For example, the control circuitry may be configured to control the gain of the amplifier circuitry such that the output signal is at a full-scale signal level or a reduced signal level.

The control circuitry may be configured to determine the gain of the amplifier circuitry based on a predefined maximum value of a parameter of the output signal.

The control circuitry may be configured to determine a scaling factor for controlling the capacitance of the variable capacitor.

The control circuitry may be configured to determine the gain of the amplifier circuitry based on a predefined maximum value of a parameter of the output signal, and the control circuitry may be configured to determine the scaling factor based on the determined gain.

The variable capacitor may comprise a switched capacitor network, for example.

Alternatively, the variable capacitor may comprise active circuitry to effect a capacitance multiplier.

According to a second aspect, the invention provides circuitry for driving a piezoelectric transducer, the circuitry comprising:
  a controllable-gain amplifier for supplying an amplified drive signal to the piezoelectric transducer;
  a variable capacitor for coupling in series with the piezoelectric transducer; and
  control circuitry, wherein the control circuitry is configured to adjust a capacitance of the variable capacitor based on a gain of the controllable-gain amplifier.

The gain of the controllable-gain amplifier may be based on a parameter of an input signal to the controllable-gain amplifier.

The gain of the controllable-gain amplifier may be selected such that the amplified drive signal is at a predefined level.

For example, the gain of the controllable-gain amplifier may be selected such that the amplified drive signal is at a full-scale signal level or a reduced signal level.

According to a third aspect, the invention provides circuitry for driving a piezoelectric transducer, the circuitry comprising:
  a first signal path for receiving a drive signal for driving the piezoelectric transducer, the first signal path comprising a first circuit node for coupling to a first terminal of the piezoelectric transducer;
  a second circuit node for coupling to a second terminal of the piezoelectric transducer;
  a capacitor for compensating for hysteresis in the piezoelectric transducer, the capacitor having a first terminal and a second terminal, wherein the first terminal is coupled to the second circuit node; and
  driver circuitry coupled to the second terminal of the capacitor,
  wherein in operation of the circuitry the driver circuitry is operative to control a voltage at the second circuit node to compensate for signal attenuation caused by the capacitor.

The capacitor may be a variable capacitor, and the driver circuitry may be operative to maintain the second circuit node at 0 volts to compensate for signal attenuation caused by the variable capacitor.

The circuitry may further comprise control circuitry configured to control a capacitance of the variable capacitor based on a parameter of the drive signal.

The capacitor may be a fixed capacitor, the circuitry may further comprise controllable-gain amplifier circuitry, and the circuitry may be configured to control the voltage at the second circuit node based on a gain of the controllable-gain amplifier circuitry.

The circuitry may further comprise control circuitry configured to control the gain of the controllable-gain amplifier circuitry based on a parameter of the drive signal.

According to a fourth aspect, the invention provides a system comprising a piezoelectric transducer and the circuitry of the first, second or third aspect.

According to a fifth aspect, the invention provides an integrated circuit comprising the circuitry of the first, second or third aspect.

According to a sixth aspect, the invention provides a device comprising the circuitry of the first, second or third aspect.

The device may comprise, for example, a mobile telephone, a tablet or laptop computer, a gaming device, an accessory device, a headset, headphones, earphones, a smart speaker.

BRIEF DESCRIPTION OF THE DRAWINGS

Embodiments of the invention will now be described, strictly by way of example only, with reference to the accompanying drawings, of which:

FIG. 2 is a schematic diagram illustrating an approach to mitigating the effect of hysteresis in a piezoelectric transducer;

DETAILED DESCRIPTION

Figure 1B:
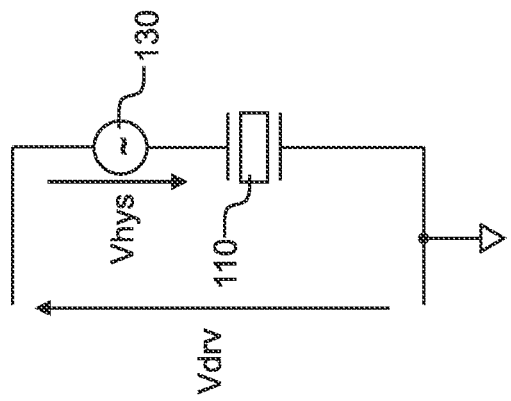
FIG. 1b is a schematic diagram illustrating an alternative model for hysteresis for a piezoelectric transducer.
Figure 1A:
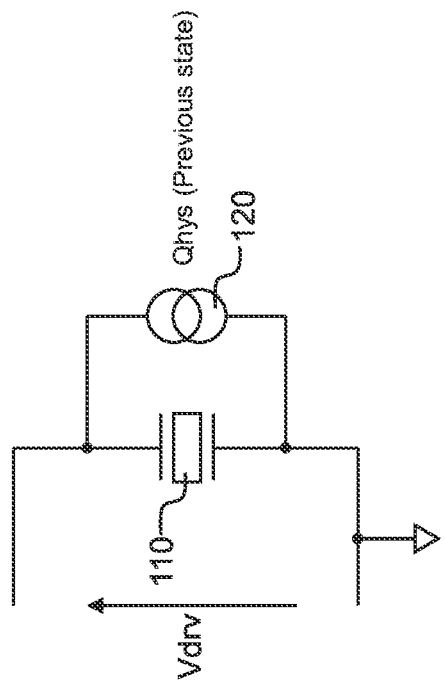
FIG. 1a is a schematic diagram illustrating a model for hysteresis for a piezoelectric transducer.

FIG. 1a is a schematic representation of a model for hysteresis in a piezoelectric transducer. The hysteresis can be modelled as a charge Qhys (represented in FIG. 1a as a current source 120) that is added to the capacitance of the piezoelectric transducer 110 as a function of a previous state of the piezoelectric transducer.

The hysteresis can equivalently be modelled as shown in FIG. 1b, as a voltage source 130 providing a voltage Vhys coupled in series with the piezoelectric transducer 110.

The displacement of the piezoelectric transducer 110 is proportional to the charge on it. When the voltage Vhys changes and the piezoelectric transducer 100 is being driven by a constant drive voltage Vdrv, the charge stored on the piezoelectric transducer 110 changes, which cause unwanted displacement of the piezoelectric transducer 110 and creep.

The charge Qp on the piezoelectric transducer 110 when it is being driven by a constant drive voltage Vdrv can be expressed as:

$$Qp = Cp(Vdrv - Vhys) \quad (1),$$

where Cp is the capacitance of the piezoelectric transducer 110.

The change in the charge Qp on the piezoelectric transducer 110 in response to a change in the hysteresis (i.e. a change in the voltage Vhys in the model of FIG. 1b) can be expressed as:

$$\frac{dQp}{dVhys} = -Cp. \quad (2)$$

FIG. 2 is a schematic diagram illustrating an approach to mitigating the effect of hysteresis in a piezoelectric transducer. As can be seen, a capacitor 210 is introduced, in series with the piezoelectric transducer 110 (and thus also the modelled hysteresis voltage source 130), such that a drive voltage Vdrv is supplied across the series combination of the piezoelectric transducer 110 and the capacitor 210.

The charge Qp on the piezoelectric transducer 110 when it is being driven by a constant voltage source can be expressed as:

$$Qp = Ct(Vdrv - Vhys) \quad (3),$$

where Ct is the total capacitance of the series combination of the piezoelectric transducer 110 and the capacitor 210.

Assuming that the capacitance has a capacitance C that is equal to αCp (where Cp is the capacitance of the piezoelectric transducer 110), then the total capacitance of the series combination of the piezoelectric transducer 110 and the capacitor 210 can be expressed as:

$$Ct = \frac{Cp\alpha Cp}{Cp + \alpha Cp} = Cp\left(\frac{\alpha}{1+\alpha}\right). \quad (4)$$

Thus, the charge Qp on the piezoelectric transducer 110 when it is being driven by a constant drive voltage Vdrv can be expressed as:

$$Qp = Cp\left(\frac{\alpha}{1+\alpha}\right)(Vdrv - Vhys). \quad (5)$$

The change in the charge Qp on the piezoelectric transducer 110 in response to a change in the hysteresis (i.e. a change in the voltage Vhys) can be expressed as:

$$\frac{dQp}{dvhys} = -Cp\left(\frac{\alpha}{1+\alpha}\right). \quad (6)$$

Thus, the series capacitor 210 reduces the sensitivity of the charge on the piezoelectric transducer 110 to hysteresis $$\left(\text{by a factor of } \frac{\alpha}{1+\alpha}\right)$$

in comparison to the model of FIG. 1b.

In order to attenuate the hysteresis, α should be less than 1 (i.e. α<1).

However, as is apparent from equation (5) above, the series capacitor 210 also reduces the sensitivity of the piezoelectric transducer 110 to the drive voltage Vdrv, such that the displacement of the piezoelectric transducer 110 for a given drive voltage Vdrv is reduced $$\left(\text{by a factor of } \frac{\alpha}{1+\alpha}\right)$$

when a series capacitor 210 is employed.

To achieve the same displacement of the piezoelectric transducer 110 for a given drive voltage Vdrv when the series capacitor 210 is provided as when there is no series capacitor 210, the drive voltage Vdrv should be increased to compensate for the effect of the charge capacitor 210. This increase may be provided by way of a compensating gain β applied to the drive voltage Vdrv, where:

$$\beta = \left(\frac{1+\alpha}{\alpha}\right). \tag{7}$$

Figure 3:
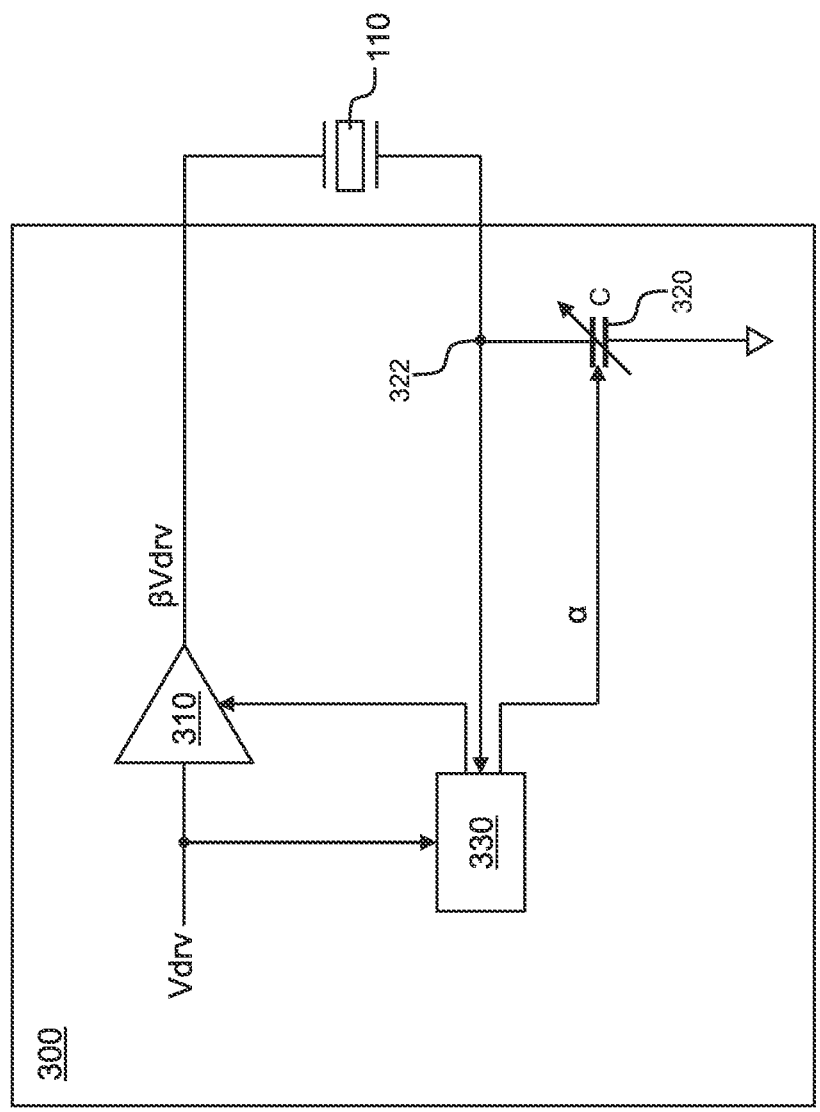
FIG. 3 is a schematic diagram illustrating driver circuitry for driving a piezoelectric transducer according to the present disclosure.

FIG. 3 is a schematic representation of driver circuitry for driving a piezoelectric transducer according to the present disclosure, in which the effects of hysteresis can be mitigated.

The circuitry, shown generally at 300 in FIG. 3, includes variable gain amplifier circuitry 310 configured to apply a gain β to a drive signal Vdrv received by the amplifier circuitry 310 from upstream circuitry (not shown) for driving a piezoelectric transducer 110. The drive signal may be, for example, an audio signal.

The circuitry 300 further includes a variable capacitor 320 coupled in series between the piezoelectric transducer 110 and a ground (or other reference voltage) supply terminal or rail.

The circuitry 300 further includes control circuitry 330, which is operative to control the gain β that is applied to the drive signal Vdrv, and to control the capacitance value C of the variable capacitor 320. Thus the control circuitry 330 is configured to receive the drive signal Vdrv and to output appropriate control signals to the amplifier circuitry 310 and the variable capacitor 320 to control the gain β and the capacitance value C of the variable capacitor 320 based (at least in part) on the received drive signal Vdrv.

More specifically, the control circuitry 330 is configured to monitor one or more parameters of the drive signal Vdrv, and to control the gain β and the capacitance value C of the variable capacitor 320 based (at least in part) on one or more of the monitored parameter(s). The monitored parameter(s) of the drive signal Vdrv may comprise, for example, a volume of an audio signal represented by the drive signal Vdrv, an envelope of the drive signal Vdrv, or an instantaneous value (e.g. an instantaneous magnitude) of the drive signal Vdrv.

In some examples the control circuitry 330 may also monitor a signal at a node 322 between the piezoelectric transducer 110 and the variable capacitor 320, and control the capacitance value C of the variable capacitor 320 and/or the gain β based (at least in part) on the monitored signal at the node 322. The monitored signal may be, or may be representative of, a voltage across the piezoelectric transducer 110 or a current through the piezoelectric transducer 110, for example. Thus the capacitance value C of the variable capacitor 320 and/or the gain β may be controlled based on a parameter of the received drive signal and/or based on the monitored signal (e.g. voltage or current) at the node 322.

The control circuitry 330 is configured to control the amplifier circuitry 310 such that the signal βVdrv output by the amplifier circuitry 310 is at a predefined level. For example, the control circuitry 330 may control the amplifier circuitry 310 such that the signal βVdrv output by the amplifier circuitry 310 is always full-scale (i.e. the signal βVdrv output by the amplifier circuitry 310 always covers the full range of output signal amplitudes that can be output without distortion by the amplifier circuitry 310, rather than being scaled (reduced) in amplitude). Alternatively, the control circuitry 330 may control the amplifier circuitry 310 such that the signal βVdrv output by the amplifier circuitry 310 is at a reduced level, e.g. −6 dB (relative to a reference level such as a full-scale signal level).

To this end the control circuitry 330 may be provided with (e.g. programmed with) or may receive (e.g. from a memory of a host device incorporating the circuitry 300) a predefined value, e.g. a predefined maximum value Vmax of a parameter (e.g. a maximum amplitude) of a signal that can be output without distortion by the amplifier circuitry 310. The control circuitry 330 is configured to determine the gain β to be applied to the drive signal Vdrv by the amplifier circuitry 310 based on this predefined value and the monitored parameter of the drive signal Vdrv. For example, where the control circuitry 330 is configured to control the amplifier circuitry 310 such that the signal βVdrv output by the amplifier circuitry 310 is always full-scale, the control circuitry 330 may determine the gain β to be applied to the drive signal Vdrv by the amplifier circuitry 310 using the equation:

$$\beta = \frac{V\text{max}}{V drv}. \tag{8}$$

The control circuitry 330 is also configured to determine a value of a scaling factor α to be applied by the control circuitry 330 to adjust the capacitance value C of the variable capacitor 320. The scaling factor α is determined by the control circuitry 330, e.g. using the equation:

$$\alpha = \frac{1}{\beta - 1}. \tag{9}$$

The control circuitry 330 controls the gain of the amplifier circuitry 310 according to the determined gain value β and controls the capacitance value C of the variable capacitor 320 according to the determined scaling factor α.

Thus the control circuitry 330 controls the capacitance of the variable capacitance to compensate for (e.g. attenuate) hysteresis in the piezoelectric transducer, and controls the gain of the amplifier circuitry 310 to compensate for signal attenuation (i.e. attenuation of the signal output by the amplifier circuitry 310) caused by the variable capacitor 320, so as to ensure that the signal βVdrv that is output by the amplifier circuitry 310 has a predefined signal level. The control circuitry 330 therefore controls the capacitance value C of the variable capacitor 320 both to compensate for the gain β that is applied to the drive signal Vdrv, and to mitigate the effects of hysteresis.

As those of ordinary skill in the art will appreciate, the variable capacitor 320 may be implemented in a number of different ways. For example, the variable capacitor 320 may be implemented using active circuitry to effect a capacitance multiplier, or using a switched capacitor network of the kind illustrated generally at 400 in FIG. 4.

The switched capacitor network 400 in this example comprises first to fourth banks 410-440 of switched capacitances.

Figure 4:
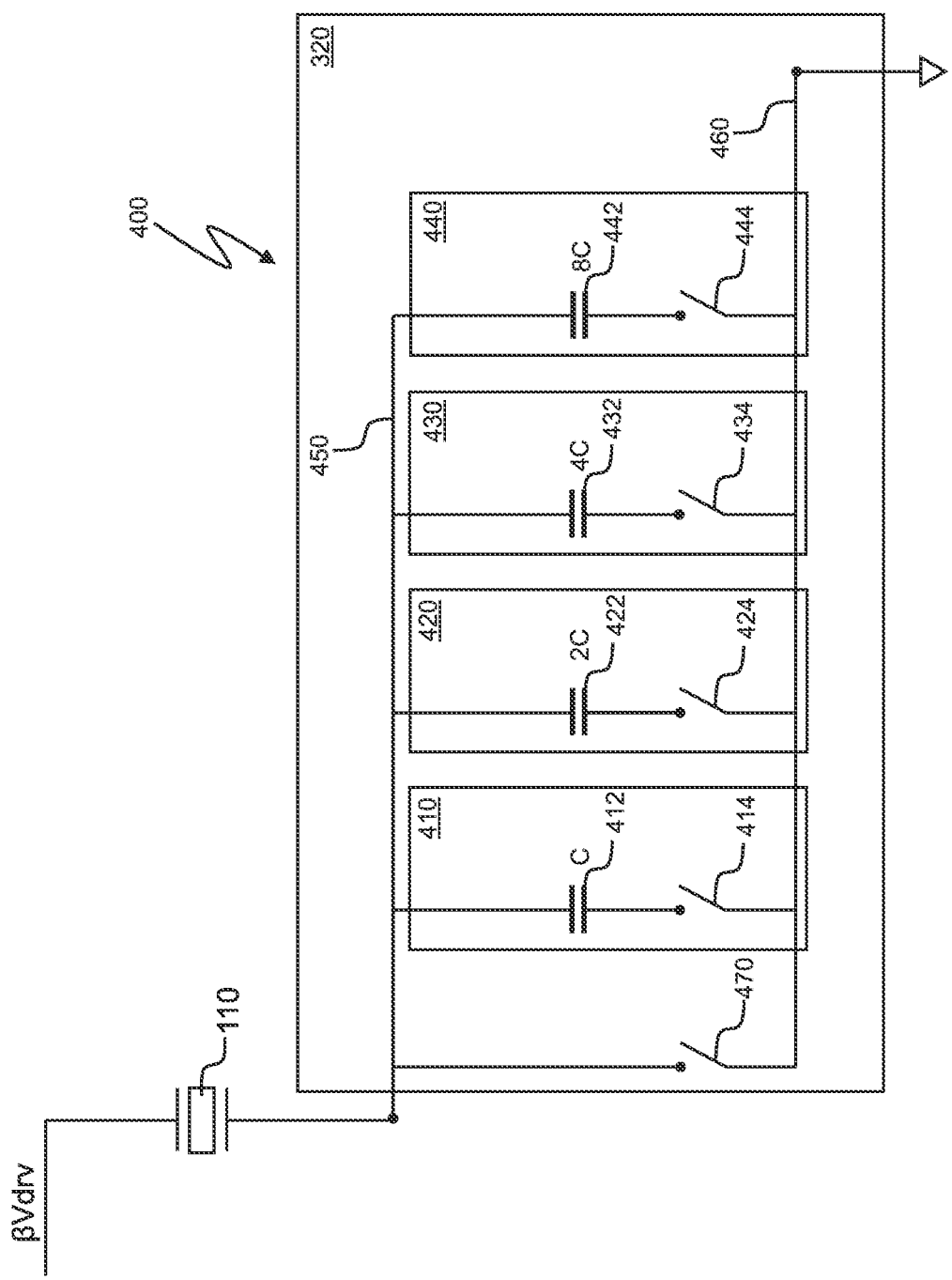
FIG. 4 is a schematic diagram illustrating example circuitry for implementing a variable capacitance.

The first bank 410 comprises a first capacitance 412 of value C coupled in series with a first switch 414 between a first rail 450 that is coupled to the piezoelectric transducer 110 and a second rail 460 that is coupled to the ground (or other reference supply) terminal of the circuitry 300. Although for clarity the first capacitance 412 is shown in FIG. 4 as a single capacitor, it will be appreciated by those skilled in the art that the first capacitance 412 could be made up of a number of separate capacitances coupled in parallel or in series in order to achieve the capacitance value C.

The second bank 420 comprises a second capacitance 422 of value 2C coupled in series with a second switch 424 between the first rail 450 and the second rail 460. Again, for clarity the second capacitance 422 is shown in FIG. 4 as a single capacitor, but it will be appreciated by those skilled in the art that the second capacitance 422 could be made up of a number of separate capacitances coupled in parallel or in series in order to achieve the capacitance value 2C.

The third bank 430 comprises a third capacitance 432 of value 4C coupled in series with a third switch 434 between the first rail 450 and the second rail 460. As before, for clarity the third capacitance 432 is shown in FIG. 4 as a single capacitor, but it will be appreciated by those skilled in the art that the third capacitance 432 could be made up of a number of separate capacitances coupled in parallel or in series in order to achieve the capacitance value 4R.

The fourth bank 440 comprises a fourth capacitance 442 of value 8C coupled in series with a fourth switch 444 between the first rail 450 and the second rail 460. Again, for clarity the fourth capacitance 442 is shown in FIG. 4 as a single capacitor, but it will be appreciated by those skilled in the art that the fourth resistance 442 could be made up of a number of separate capacitances coupled in series or parallel in order to achieve the resistance value 8C.

The switched capacitor network 400 further includes a fifth switch 470, coupled in series between the first rail 450 and the second rail 460, which can be actuated to bypass the first to fourth banks 410-440 such that the variable capacitor 320 provides no capacitance.

The capacitance value of the variable capacitor 320 can be adjusted by selectively opening and closing the switches 414-444 in accordance with, in this example, a four-bit input digital word or code.

Thus for an input digital word of value 0001, the first switch 414 would be closed and the second, third and fourth switches 424-444 would be open. The capacitance value of the variable capacitor 320 would thus be equal to C.

For an input digital word of value 0010, the second switch 424 would be closed and the first, third and fourth switches 414, 434, 444 would be open. The capacitance value of the variable capacitor 320 would thus be equal to 2C.

For an input digital word of value 0011, the first and second switches 414, 424 would be closed and the third and fourth switches 434, 444 would be open. The capacitance value of the variable capacitor 320 would thus be equal to the parallel combination of C and 2C, i.e. 3C.

It will be appreciated that FIG. 4 illustrates the principle of using a switched capacitor network as a variable capacitance. The specific number of banks of switched capacitances, and the values of the capacitances within the banks, will be determined or selected according to the particular application for which the switched capacitor network 400 is used.

Figure 5:
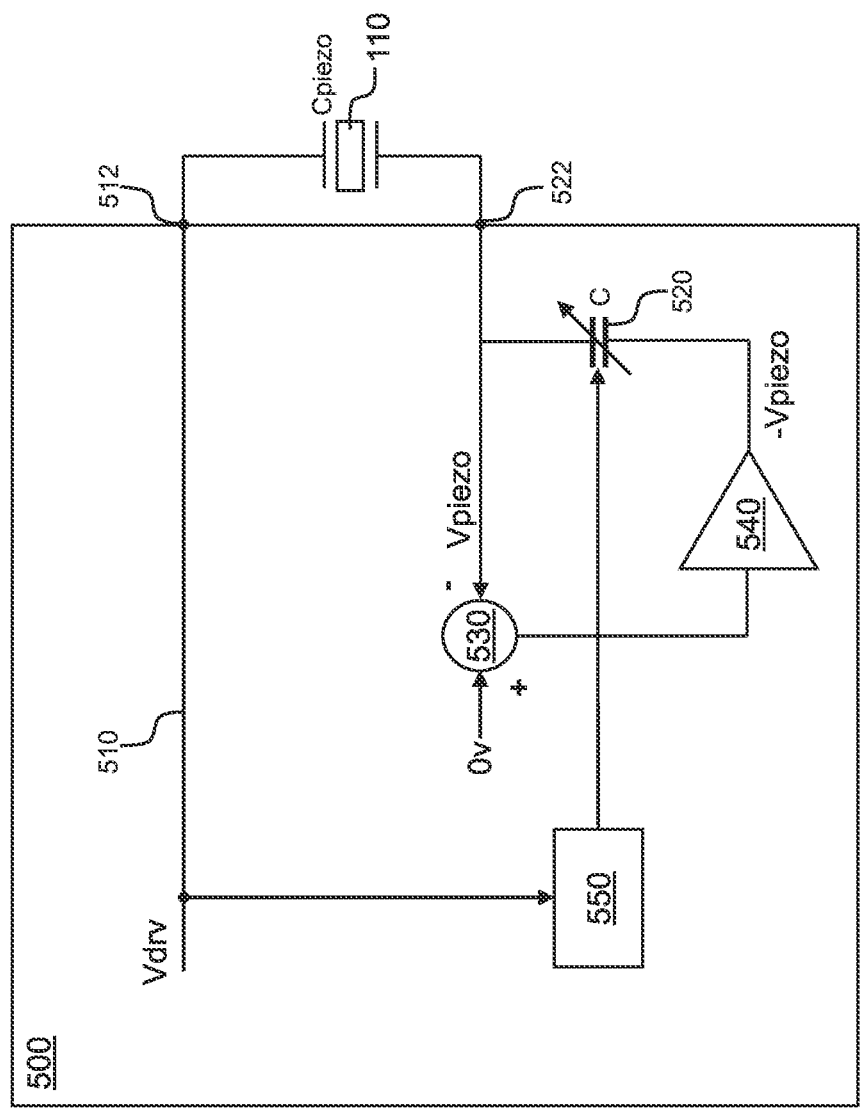
FIG. 5 is a schematic representation of further alternative driver circuitry for driving a piezoelectric transducer according to the present disclosure.

FIG. 5 is a schematic representation of alternative driver circuitry for driving a piezoelectric transducer according to the present disclosure, in which the effects of hysteresis can be mitigated.

The driver circuitry, shown generally at 500 in FIG. 5, includes a first signal path 510 for receiving a drive signal Vdrv for driving a piezoelectric transducer 110. The first signal path 510 terminates in a first circuit node 512, to which a first terminal of the piezoelectric transducer 110 can be coupled.

The circuitry 500 further includes a variable capacitor 520 having a first terminal which is coupled to a second circuit node 522, to which a second terminal of the piezoelectric transducer 110 can be coupled. The variable capacitor 320 may be implemented, for example, using active circuitry to effect a capacitance multiplier, or using a switched capacitor network of the kind shown in FIG. 4.

The circuitry 500 further includes a subtractor 530, having a first input which is coupled to a ground or 0 volts reference source, and a second input which is coupled to the second circuit node 522.

An output of the subtractor 530 is coupled to an input of drive circuitry 540, which in this example implements a buffer amplifier. An output of the drive circuitry 540 is coupled to a second terminal of the variable capacitor 520.

The circuitry 500 may further include control circuitry 550, configured to receive the drive signal Vdrv and to control the capacitance of the variable capacitor 520 based on a parameter such as a volume of an audio signal represented by the drive signal Vdrv, an envelope of the drive signal Vdrv or an instantaneous value (e.g. an instantaneous magnitude) of the drive signal Vdrv.

In operation of the circuitry 500, the series combination of the capacitance Cpiezo of the piezoelectric transducer 110 and the variable capacitor 520 forms a capacitive voltage divider, and a voltage Vpiezo develops at the second circuit node 522. As will be understood by those of ordinary skill in the art, $$Vpiezo = Vdrv \cdot \frac{Cpiezo}{Cpiezo + C}. \tag{10}$$

The subtractor 530 subtracts the voltage Vpiezo received at its second input from the 0 volts or ground reference voltage received at its first input and outputs a voltage −Vpiezo to the driver circuitry 540. Thus the voltage at the second terminal of the variable capacitor 520 is equal to −Vpiezo.

As a result, the second circuit node 522, to which the second terminal of the piezoelectric transducer 110 is coupled, is effectively at 0 volts, such that the full-scale drive signal Vdrv appears across the piezoelectric transducer 110.

Thus, in contrast to the circuitry 300 of FIG. 3, in which the variable capacitor 320 compensates for hysteresis in the piezoelectric transducer 110 and the gain β applied to the drive signal Vdrv by the amplifier circuitry 310 compensates for the attenuation of the drive signal that would otherwise occur due to the variable capacitor 320, in the circuitry 500 of FIG. 5 the variable capacitance 520 compensates for hysteresis in the piezoelectric transducer 110, and the drive signal attenuation caused by the variable capacitor 520 is compensated by driving the second terminal of the variable capacitor 520 such that the second circuit node 522 is effectively at 0 volts. Thus in the circuitry 500 no amplification of the drive signal Vdrv is required to compensate for the attenuation caused by the variable capacitor 520.

Figure 6:
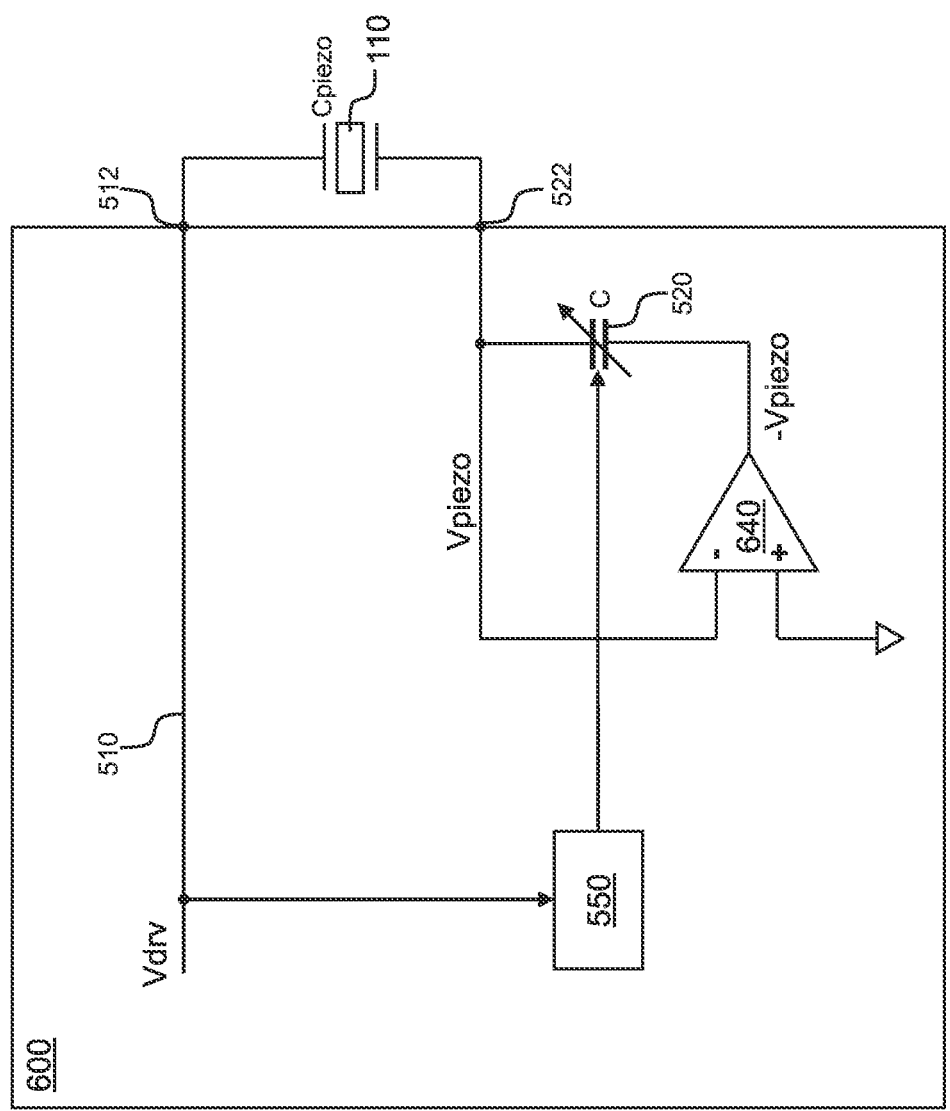
FIG. 6 is a schematic representation of further alternative driver circuitry for driving a piezoelectric transducer according to the present disclosure.

FIG. 6 is a schematic representation of further alternative driver circuitry for driving a piezoelectric transducer according to the present disclosure, in which the effects of hysteresis can be mitigated.

The driver circuitry, shown generally at 600 in FIG. 6, shares many elements in common with the circuitry 500 of FIG. 5. Such common elements are denoted by common reference numerals in FIGS. 5 and 6 and will not be described in detail here.

The circuitry 600 differs from the circuitry 500 in that it includes inverting differential amplifier circuitry 640 in place of the subtractor 530 and driver circuitry 540.

The differential amplifier circuitry 640 has a first, inverting, input coupled to the second circuit node 522 and a second, non-inverting, input coupled to a 0 volts or ground reference source.

In operation of the circuitry 600, a voltage Vpiezo develops at the second circuit node 522 as a result of the drive signal Vdrv, and is received at the first, inverting, input of the amplifier circuitry 640. As the voltage Vpiezo is greater than the voltage (0 volts) at the second, non-inverting, input of the amplifier circuitry 640, the amplifier circuitry 640 outputs a voltage −Vpiezo to the second terminal of the variable capacitor 520.

As in the circuitry 500, the second circuit node 522, to which the second terminal of the piezoelectric transducer 110 is coupled, is thus effectively at 0 volts, such that the full-scale drive signal Vdrv appears across the piezoelectric transducer 110.

Thus in the circuitry 600 of FIG. 6 the variable capacitance 520 compensates for hysteresis in the piezoelectric transducer 110, and the drive signal attenuation caused by the variable capacitor 520 is compensated by driving the second terminal of the variable capacitor 520 such that the second circuit node 522 is effectively at 0 volts. Thus no amplification of the drive signal Vdrv is required to compensate for the attenuation caused by the variable capacitor 520.

Where the circuitry 500, 600 is used for audio applications (i.e. where the piezoelectric transducer is used as an audio output transducer) a change in the capacitance of the variable capacitor 520 may give rise to audible artefacts such as click or pop sounds in the signal output by the piezoelectric transducer 110. Thus it may be desirable to synchronise changes in the capacitance of the variable capacitor 520 to points at which the input signal Vdrv crosses 0v. Alternatively, if the voltage across the variable capacitor 520 can be copied to one or more reserve capacitors in advance of a change in the capacitance of the variable capacitor 520, the capacitance may be changed at any time. However, both of these solutions require additional circuitry and give rise to increased complexity in controlling the circuitry 500, 600.

Figure 7:
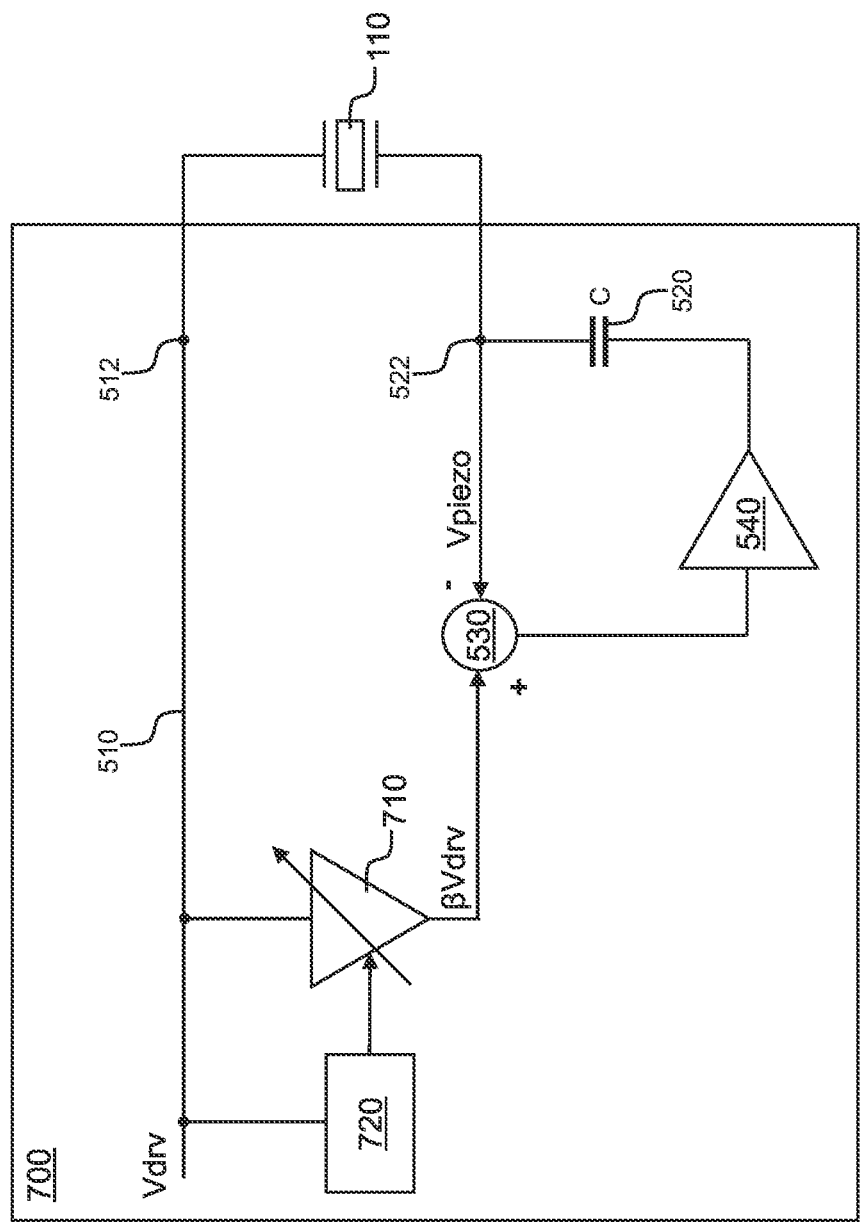
FIG. 7 is a schematic representation of further alternative driver circuitry for driving a piezoelectric transducer according to the present disclosure.

FIG. 7 is a schematic representation of further alternative driver circuitry for driving a piezoelectric transducer according to the present disclosure, in which the effects of hysteresis can be mitigated.

The driver circuitry, shown generally at 700 in FIG. 7, shares many elements in common with the circuitry 500 of FIG. 5. Such common elements are denoted by common reference numerals in FIGS. 5 and 6 and will not be described in detail here.

The circuitry 700 differs from the circuitry 500 in that, instead of being coupled to a 0 volts or ground reference source, the first input of the subtractor 530 is coupled to an output of controllable-gain amplifier circuitry 710 that is provided in a feedforward path between the first signal path 510 and the first input of the subtractor 530. Thus an input of the controllable-gain amplifier circuitry 710 is coupled to the first signal path 510 so as to receive the drive signal Vdrv.

The circuitry 700 may further include control circuitry 720 configured to receive the drive signal Vdrv and to control a gain β of the controllable-gain amplifier circuitry 710 based on a parameter such as a volume of an audio signal represented by the drive signal Vdrv, an envelope of the drive signal Vdrv or an instantaneous value (e.g. an instantaneous magnitude) of the drive signal Vdrv.

In operation of the circuitry 700, the controllable gain amplifier 710 outputs a voltage βVdrv to the first input of the subtractor 530. The voltage Vpiezo (which develops at the second circuit node 522 as a result of the drive signal Vdrv) is received at the second input of the subtractor 530 and an output signal (equal to βVdrv−Vpiezo) is output by the subtractor 530 to the driver circuitry 540 and thus appears at the second terminal of the variable capacitor 520.

By adjusting the gain β of the controllable-gain amplifier circuitry 710, a level of drive signal attenuation can be adjusted.

For example, where the drive signal Vdrv is a high amplitude signal (e.g. a high-volume audio signal), the control circuitry 720 may reduce the gain β of the controllable-gain amplifier circuitry 710 to zero. Thus βVdrv=0 and the circuitry 700 operates in the same way as the circuitry 500 described above, providing a voltage −Vpiezo at the second terminal of the variable capacitor 520 such that the second circuit node 522 is effectively at 0 volts and thus the full-scale drive signal Vdrv appears across the piezoelectric transducer 110.

Where the drive signal is a lower amplitude signal (e.g. a lower-volume audio signal), the control circuitry may increase the gain β of the controllable-gain amplifier circuitry 710, such that the level of attenuation of the hysteresis is reduced.

The resolution with which the gain β of the controllable-gain amplifier circuitry 710 can be adjusted may be sufficiently high as to permit smooth changes in the gain β at any time without giving rise to audible artefacts.

As will be appreciated by those of ordinary skill in the art, the subtractor 530 and driver circuitry 540 of FIG. 7 could be replaced by differential amplifier circuitry of the kind shown at 640 in FIG. 6, with the exception that the non-inverting input of the amplifier circuitry 640 would be coupled to the output of the controllable-gain amplifier circuitry 710 rather than to a 0 volt or ground reference supply.

The circuitry 300, 500, 700 may be provided as an integrated circuit (or as part of an integrated circuit). The present disclosure also extends to a system comprising the circuitry 300, 500, 700 (whether implemented as an integrated circuit or part of an integrated circuit or implemented in discrete circuitry) and a piezoelectric transducer 110.

As will be apparent from the foregoing description, the circuitry 300, 500, 700 of the present disclosure is able to compensate for hysteresis in a piezoelectric transducer, and thus can reduce distortion in an audible output of the piezoelectric transducer.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device, or a gaming device such as a games console. The device could be a wearable device such as a smartwatch, eyewear (e.g. smart glasses) or the like. The device could be a virtual reality (VR) or augmented reality (AR) device such as a VR or AR headset. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a piezoelectric transducer, the circuitry comprising:
   amplifier circuitry configured to receive a drive signal and to output an output signal, based on the drive signal, to the piezoelectric transducer;
   a variable capacitor configured to be coupled in series with the piezoelectric transducer; and
   control circuitry, wherein the control circuitry is configured to control a capacitance of the variable capacitor to compensate for hysteresis in the piezoelectric transducer and to control a gain of the amplifier circuitry to compensate for signal attenuation caused by the variable capacitor.

2. Circuitry according to claim 1, wherein the control circuitry is configured to control the gain of the amplifier circuitry and the capacitance of the variable capacitor based at least in part on a parameter of the drive signal received by the amplifier circuitry.

3. Circuitry according to claim 2, wherein the parameter comprises one or more of:
- a volume of an audio signal represented by the drive signal;
- an envelope of the drive signal; and
- an instantaneous value of the drive signal.

4. Circuitry according to claim 1 wherein the control circuitry is configured to monitor a signal at a node coupled to the piezoelectric transducer and to control the gain of the amplifier circuitry and the capacitance of the variable capacitor based at least in part on the monitored signal.

5. Circuitry according to claim 4 wherein the monitored signal comprises a voltage across the piezoelectric transducer or a current through the piezoelectric transducer.

6. Circuitry according to claim 1, wherein the control circuitry is configured to control the gain of the amplifier circuitry such that the output signal is at a predefined level.

7. Circuitry according to claim 6, wherein the control circuitry is configured to control the gain of the amplifier circuitry such that the output signal is at a full-scale signal level or a reduced signal level.

8. Circuitry according to claim 4, wherein the control circuitry is configured to determine the gain of the amplifier circuitry based on a predefined maximum value of a parameter of the output signal.

9. Circuitry according to claim 1, wherein the control circuitry is configured to determine a scaling factor for controlling the capacitance of the variable capacitor.

10. Circuitry according to claim 9, wherein:
- the control circuitry is configured to determine the gain of the amplifier circuitry based on a predefined maximum value of a parameter of the output signal; and
- the control circuitry is configured to determine the scaling factor based on the determined gain.

11. Circuitry according to claim 1, wherein the variable capacitor comprises a switched capacitor network or active circuitry to effect a capacitance multiplier.

12. A system comprising a piezoelectric transducer and the circuitry of claim 1.

13. Circuitry for driving a piezoelectric transducer, the circuitry comprising:
- a controllable-gain amplifier for supplying an amplified drive signal to the piezoelectric transducer;
- a variable capacitor for coupling in series with the piezoelectric transducer; and
- control circuitry, wherein the control circuitry is configured to adjust a capacitance of the variable capacitor based on a gain of the controllable-gain amplifier.

14. Circuitry according to claim 13, wherein the gain of the controllable-gain amplifier is based on a parameter of an input signal to the controllable-gain amplifier.

15. Circuitry according to claim 13, wherein the gain of the controllable-gain amplifier is selected such that the amplified drive signal is at a predefined level.

16. Circuitry according to claim 15, wherein the gain of the controllable-gain amplifier is selected such that the amplified drive signal is at a full-scale signal level or a reduced signal level.

17. Circuitry for driving a piezoelectric transducer, the circuitry comprising:
- a first signal path for receiving a drive signal for driving the piezoelectric transducer, the first signal path comprising a first circuit node for coupling to a first terminal of the piezoelectric transducer;
- a second circuit node for coupling to a second terminal of the piezoelectric transducer;
- a capacitor for compensating for hysteresis in the piezoelectric transducer, the capacitor having a first terminal and a second terminal, wherein the first terminal is coupled to the second circuit node; and
- driver circuitry coupled to the second terminal of the capacitor,
- wherein in operation of the circuitry the driver circuitry is operative to control a voltage at the second circuit node to compensate for signal attenuation caused by the capacitor.

18. Circuitry according to claim 17, wherein the capacitor is a variable capacitor, and wherein the driver circuitry is operative to maintain the second circuit node at 0 volts to compensate for signal attenuation caused by the variable capacitor.

19. Circuitry according to claim 18, further comprising control circuitry configured to control a capacitance of the variable capacitor based on a parameter of the drive signal.

20. Circuitry according to claim 17, wherein:
- the capacitor is fixed capacitor;
- the circuitry further comprises controllable-gain amplifier circuitry; and
- the circuitry is configured to control the voltage at the second circuit node based on a gain of the controllable-gain amplifier circuitry.

21. Circuitry according to claim 20, further comprising control circuitry configured to control the gain of the controllable-gain amplifier circuitry based on a parameter of the drive signal.

22. An integrated circuit comprising the circuitry of claim 1.

23. A device comprising the circuitry of claim 1.

24. A device according to claim 23, wherein the device comprises a mobile telephone, a tablet or laptop computer, a gaming device, an accessory device, a headset, headphones, earphones, a smart speaker.

* * * * *

UNITED STATES PATENT AND TRADEMARK OFFICE
CERTIFICATE OF CORRECTION

PATENT NO. : 11,646,708 B2
APPLICATION NO. : 17/113561
DATED : May 9, 2023
INVENTOR(S) : Lesso et al.

It is certified that error appears in the above-identified patent and that said Letters Patent is hereby corrected as shown below:

In the Claims

Column 14, Line 50, in Claim 24, delete "a smart" and insert -- or a smart --, therefor.

Signed and Sealed this
First Day of August, 2023

Katherine Kelly Vidal
*Director of the United States Patent and Trademark Office*